United States Patent
Bagga et al.

(10) Patent No.: US 10,903,805 B2
(45) Date of Patent: Jan. 26, 2021

(54) LOW NOISE AMPLIFIER WITH REACTIVE FEEDBACK

(71) Applicant: NOVELDA AS, Kviteseid (NO)

(72) Inventors: Sumit Bagga, Oslo (NO); Kristian Granhaug, Oslo (NO)

(73) Assignee: Novelda AS, Oslo (NO)

( * ) Notice: Subject to any disclaimer, the term of this patent is extended or adjusted under 35 U.S.C. 154(b) by 0 days.

(21) Appl. No.: 16/326,469

(22) PCT Filed: Aug. 17, 2017

(86) PCT No.: PCT/GB2017/052439
§ 371 (c)(1),
(2) Date: Feb. 19, 2019

(87) PCT Pub. No.: WO2018/033743
PCT Pub. Date: Feb. 22, 2018

(65) Prior Publication Data
US 2019/0356280 A1 Nov. 21, 2019

(30) Foreign Application Priority Data
Aug. 19, 2016 (GB) .................................. 1614239.0

(51) Int. Cl.
*H03F 1/34* (2006.01)
*H03F 1/56* (2006.01)
*H03F 3/45* (2006.01)

(52) U.S. Cl.
CPC ......... *H03F 1/565* (2013.01); *H03F 3/45179* (2013.01); *H03F 2200/294* (2013.01); *H03F 2200/387* (2013.01)

(58) Field of Classification Search
CPC ................. H03F 1/34; H03F 2200/534; H03F 2200/537; H03F 2200/541
(Continued)

(56) References Cited

U.S. PATENT DOCUMENTS 7,123,090 B2 * 10/2006 Ratzel ................ G01R 33/3621
330/165

FOREIGN PATENT DOCUMENTS

EP          2 313 970 B1    4/2013
WO    WO 2010/007177 A1    1/2010

OTHER PUBLICATIONS

Bagga et al., "A Frequency-Selective Nested Dual-Loop Broadband Low-Noise Amplifier in 90 nm CMOS", ESSCIRC (ESSCIRC), 2012, Proceedings of the, Sep. 2012, ISSN 1930-8833.
(Continued)

*Primary Examiner* — Steven J Mottola
(74) *Attorney, Agent, or Firm* — Klarquist Sparkman, LLP (57) ABSTRACT

An amplifier, comprising: an amplifying element having an input side and an output side; a first transformer on the output side of the amplifying element arranged to mutually couple a fraction of the output current from the amplifying element onto the input side of the amplifying element; a second transformer on the input side of the amplifying element arranged to increase the input voltage on the input side via mutual coupling of its primary and secondary windings; wherein a primary winding of the first transformer is connected to an output of the amplifying element; wherein a secondary winding of the first transformer is ac connected to a secondary winding of the second transformer; and wherein the primary winding of the first transformer is dc blocked from the secondary winding of the second transformer. The negative and the positive reactive feedback loops are not formed from the same trifilar transformer.

18 Claims, 10 Drawing Sheets

(58) Field of Classification Search
USPC .................................. 330/79, 165, 188, 195
See application file for complete search history.

(56) References Cited

OTHER PUBLICATIONS

Chang et al., "An Ultra-Low-Power Transformer-Feedback 60 GHz Low-Noise Amplifier in 90 nm CMOS", IEEE Microwave and Wireless Components Letters, vol. 22, Issue: 4 pp. 197-199, 2012, ISSN 1531-1309.
European Search Report Under Section 17(5), dated Feb. 16, 2017, 4 pages.
International Search Report and Written Opinion for PCT/GB2017/052439, dated Nov. 8, 2017, 12 pages.
Official Action (with translation) for TW106127731, dated Oct. 27, 2020, 11 pages.

* cited by examiner

LOW NOISE AMPLIFIER WITH REACTIVE FEEDBACK

CROSS REFERENCE TO RELATED APPLICATIONS

This is the U.S. National Stage of International Application No. PCT/GB2017/052439, filed Aug. 17, 2017, which was published in English under PCT Article 21(2), which in turn claims the benefit of Great Britain Application No. 1614239.0, filed Aug. 19, 2016.

The invention relates to amplifiers, in particular to low-noise amplifiers and more particularly to low-noise amplifiers employing inductance as part of the impedance and noise-matching and gain-boosting mechanism.

There is a general desire to improve gain in amplifiers, especially in low-power RF receivers. However, as well as providing gain, it is also important that the low-noise amplifier has a well-defined input impedance so that it is power matched to the antenna for maximum power transfer between these two blocks in RF front-end. It will be appreciated that this is particularly important in low-noise amplifiers working with already very low-levels input signals.

A certain class of low-noise amplifiers (LNAs) uses monolithic transformers arranged to create a negative reactive feedback loop across an amplifying element (typically one or more transistors) by way of mutual inductance so as to provide some control over the current or voltage at the input of said amplifying element. For example, by feeding a fraction of the output current to the input of the amplifying element with an intrinsic voltage-to-current transfer, a well-defined relationship between input current and voltage is formulated and thus the input impedance (a function of input current and voltage) is defined. The choice of particular component characteristics (such as winding self-inductances, transformer turns ratios, mutual coupling coefficient(s) and transistor characteristics, e.g., transconductance) can be optimized so as to set a desired input impedance. For example, a common desired single-ended input impedance is 50Ω for matching to a 50Ω antenna in RF applications.

In such arrangements, in tandem with the negative feedback loop, a second positive reactive feedback loop across said amplifying element(s) may be employed for gain-boosting. In some arrangements a trifilar (a transformer with three separate but coupled windings) is used to provide both the positive and negative feedback loops, e.g. by providing negative feedback from the primary to the secondary winding and positive feedback from the secondary to the tertiary winding. However, there is then an unwanted mutual inductance between the tertiary and the primary windings which reduces the overall gain-boosting mechanism and/or the impedance-noise matching that can be achieved by this arrangement. Therefore while this provides increased gain, it is still gain limited. Also, when implemented as an integrated circuit, trifilars and multi-winding transformer designs typically require a fabrication process using two thick RF metal layers (e.g., Cu/Al) so that the high-Q transformer can be a stacked/overlay configuration (as interwound or concentric geometries do not provide high mutual inductance). As a two thick metal layer fabrication process is more expensive, this adds to the cost of the end product.

According to the invention there is provided an amplifier, comprising: an amplifying element having an input side and an output side; a first transformer on the output side of the amplifying element arranged to mutually couple a fraction of the output current from the amplifying element onto the input side of the amplifying element; a second transformer on the input side of the amplifying element arranged to increase the input voltage on the input side via mutual coupling of its primary and secondary windings; wherein a primary winding of the first transformer is connected to an output of the amplifying element; wherein a secondary winding of the first transformer is ac connected to a secondary winding of the second transformer; and wherein the primary winding of the first transformer is dc blocked from the secondary winding of the second transformer.

With this arrangement, the negative and the positive reactive feedback loops are not formed from the same trifilar transformer. Therefore, there is no unwanted feedback between the primary and tertiary windings as described above that detracts from the gain and/or impedance-noise matching. The positive reactive loop is provided by the second transformer provided solely on the input side of the amplifying element. The negative reactive feedback loop is provided via the first transformer that provides its feedback (ac coupling) to the second transformer without the two transformers being mutually coupled, but with a dc block that maintains the dc isolation across the amplifying element.

A significant advantage of this arrangement compared with the trifilar design is that in addition to removing the unwanted coupling between primary and tertiary windings (i.e., selective mutual coupling), the amplifier can be fabricated on chip using one thick RF metal layer fabrication process. In order to achieve high mutual coupling (for better electrical performance) between the windings, the trifilar design requires a fabrication process with at least two thick RF metal layers so that the trifilar can be formed in a stacked/overlay configuration. Such processes tend to be expensive and add significantly to the fabrication cost of the integrated circuit. By contrast, the transformers of this invention can be formed on chip in one thick RF metal layer with an interwound (or similar) configuration, thus significantly reducing the fabrication cost.

The first and second transformers may be any type of transformers such as bifilar transformers, auto-transformers or centre-tapped inductors (being symmetrical auto-transformers). The first and second transformers do not need to be of the same type, although they can be. For example, one bifilar and one auto-transformer may be used (with either the first or second transformer being the auto-transformer), or two bifilars may be used or two auto-transformers may be used.

In preferred embodiments, the first transformer is an auto-transformer and the secondary winding of the first transformer is ac coupled to the secondary winding of the second transformer through a capacitive element (capacitor) to provide said dc blocking.

Using autotransformers is particularly convenient for circuit design. An autotransformer is a single winding element with at least three terminals; two end terminals and one or more terminals at intermediate points. This facilitates symmetrical (e.g., center-tap for balanced to unbalanced conversion) and asymmetrical configurations. However, unlike a transformer, it does not provide dc isolation between its windings.

Thus, where the first transformer is an autotransformer, the connection between the first transformer and the second transformer is made through a dc block capacitor so that the two sides of the amplifying element operate at different dc potentials, while the ac signal is coupled back to the input for the negative feedback.

The first transformer may be an asymmetrical autotransformer, with either the primary or secondary winding having the higher self inductance. However, preferably the first transformer is a symmetrical autotransformer, i.e. essentially a centre-tapped inductor with an effective turns ration of 1:1 between its primary and secondary windings. With this arrangement, the sensed current from the output of the amplifying element is essentially copied by the autotransformer and fed back to the input side of the amplifying element. Forming the first transformer asymmetrically, i.e. with its primary and secondary windings having different self-inductances, could be used to add further to the gain-boosting and/or impedance-noise matching. However, the effect of this asymmetry is likely to be much less than the gain-boosting effect of the second transformer which preferably has a much larger self-inductance. The symmetrical auto-transformer has an intermediate center-tap point and is therefore preferred.

In alternative arrangements, instead of using autotransformers the primary winding and the secondary winding of the first transformer are not dc connected such that the first transformer provides said dc blocking (dc isolation). This would be the case with, for example, a normal bifilar (or two windings of a trifilar) transformer. With such arrangements, as the normal transformer arrangement provides a dc block between its primary and secondary windings, the dc blocking capacitor discussed above is not required.

As mentioned above, the second transformer may also be any type of transformer, but is preferably an auto-transformer. Again, this is convenient for circuit design especially in a single thick metal layer fabrication process in which autotransformers are a good way to achieve moderate-to-high mutual coupling. Preferably both the first and second transformers are autotransformers, although it will be appreciated that this is not essential and that the circuit is still perfectly functional with either one of the transformers (or both of them) as more conventional (non-auto) transformers.

Preferably the second transformer is a symmetrical autotransformer, i.e. with an effective turns ration of 1:1 between its primary and secondary windings. Again this is convenient for circuit arrangements. Although a higher turns ratio could be employed for higher gain-boosting, it is generally preferred to avoid large inductances in the windings of the second transformer as this can result in the winding inductance approaching its self-resonance frequency, particularly in amplifiers operating at high frequencies, e.g. wideband amplifiers.

It will be appreciated that references to turns ratios or effective turns ratios should be understood as being the ratio of the self-inductances of the windings. In integrated circuit transformers, transformer windings have to be laid out in essentially two dimensions. Multiple turns of a winding are typically wound in a spiral and thus different turns have different sizes. Thus the size (i.e. area) of the turns is often more important than the number of turns and a coil design will take into account both the number of turns and the area of each. Overall, it is the self-inductance of each winding that is important, and therefore it is the ratio of the self-inductances that determines the transformer properties.

It will also be appreciated that either winding of the transformer may be considered as the primary winding or the secondary winding. There is no particular convention as to which winding should be termed primary and which winding should be termed secondary. In this document the use of these terms should not be taken to mean anything other than a label used to distinguish between different windings.

Preferably the current is sensed at a non-inverting output of the amplifying element.

Thus preferably the first transformer is connected to a non-inverting output of said amplifying element. Preferably, the first transformer is arranged as a current inverting transformer. The combination of sensing current on the non-inverting output of the amplifying element and coupling at via an inverting transformer results in a net inversion (180 degrees phase shift) and hence negative feedback. The first transformer is coupled to the secondary winding of the second transformer (with its intermediate tap point receiving the input to the amplifier, e.g. the RF input signal from an antenna) to form a negative feedback loop. It will be appreciated that in other embodiments, the current may be sensed at an inverting output of the amplifying element, in which case the first transformer should be configured as a non-inverting transformer so that the overall combination is again a current inversion and hence negative feedback.

Although it will be appreciated that the principles described above may apply to any amplifying means, the amplifying element is preferably a transistor. This may be a bipolar junction transistor (BJT), but more conveniently the transistor may be a FET, preferably a MOSFET.

Any suitable amplifier configuration may be used, but for the largest gain, the FET is preferably arranged in a common source configuration. It will be appreciated that in a BJT arrangement, this equates to a common-emitter configuration.

Preferably the first transformer (or more specifically one winding thereof) is connected to the FET's source and the second transformer (or more specifically one winding thereof) is connected to the FET's gate. The first transformer senses the current on the output of the transistor while the second transformer is arranged to increase the voltage at the input of said transistor, and thus its intrinsic transconductance.

Where the second transformer is an autotransformer, an RF input signal is preferably applied at the intermediate tap point of the second transformer. Where the first transformer is an autotransformer, the transistor is preferably biased with a dc current source connected at the intermediate tap point (ac ground node) of the first transformer.

In preferred embodiments the first transformer is an autotransformer, the second transformer is an autotransformer and the self-inductances of the second transformer windings are greater than the self-inductances of the first transformer windings. The ratio of the square root of the self-inductances of these two transformers gives an effective turns ratio for the negative reactive feedback and this determines the amount of the negative reactive feedback. It is preferred that the negative reactive feedback loop is made the dominant loop so as to provide unconditional stability to the amplifier. This simply means that the negative feedback is strong enough that it prevents any other feedback in the circuit from pushing the circuit out of the state of unconditional stability. However, it should be noted that this circuit is inherently very stable. A large negative feedback improves the linearity of the circuit.

While the above circuit may be used as a single-ended amplifier, in some preferred arrangements it may be implemented as part of a differential amplifier for amplifying both the positive and negative signals. Accordingly, in preferred arrangements there is provided a differential amplifier comprising a positive half and a negative half, wherein the positive half and the negative half each comprise an amplifier as described above, optionally including any of the preferred and optional features also described above.

The first transformer in each of the positive and negative halves may have primary and secondary windings that are not dc connected. Although the two first transformers of the two signal halves may be formed as separate components, this arrangement is particularly convenient in a differential amplifier as the two corresponding transformers from the two halves can be combined into a single transformer.

Thus, preferably the primary winding of the first transformer of the positive half and the primary winding of the first transformer of the negative half are directly connected and form a primary winding of a center-tapped transformer; and the secondary winding of the first transformer of the positive half and the secondary winding of the first transformer of the negative half are directly connected and form a secondary winding of said centre-tapped transformer. Each side of the centre-tapped transformer is thus formed as center-tapped inductor, with half of the inductor being utilised for each of the signal halves. The mirror symmetry of this arrangement results in an ac ground at the center-taps.

Viewed from another aspect, the invention provides a method of amplifying a signal comprising: applying the signal to an input of an amplifying element; sensing the current at an output of said amplifying element with a primary winding of a first transformer; ac coupling at least a part of said sensed current via a secondary winding of said first transformer and a secondary winding of a second transformer to an input of said amplifying element; wherein said primary winding of said first transformer is dc blocked from said secondary winding of said second transformer;

and coupling a fraction of the input voltage applied to the amplifying element across the secondary winding of the second transformer and adding it to the input signal at the gate of said amplifying element via the primary winding of the second transformer.

All of the preferred features described above in relation to the apparatus apply equally to the method of operation.

Certain preferred embodiments of the invention will now be described, by way of example only, and with reference to the accompanying drawings in which.

Figure 1:
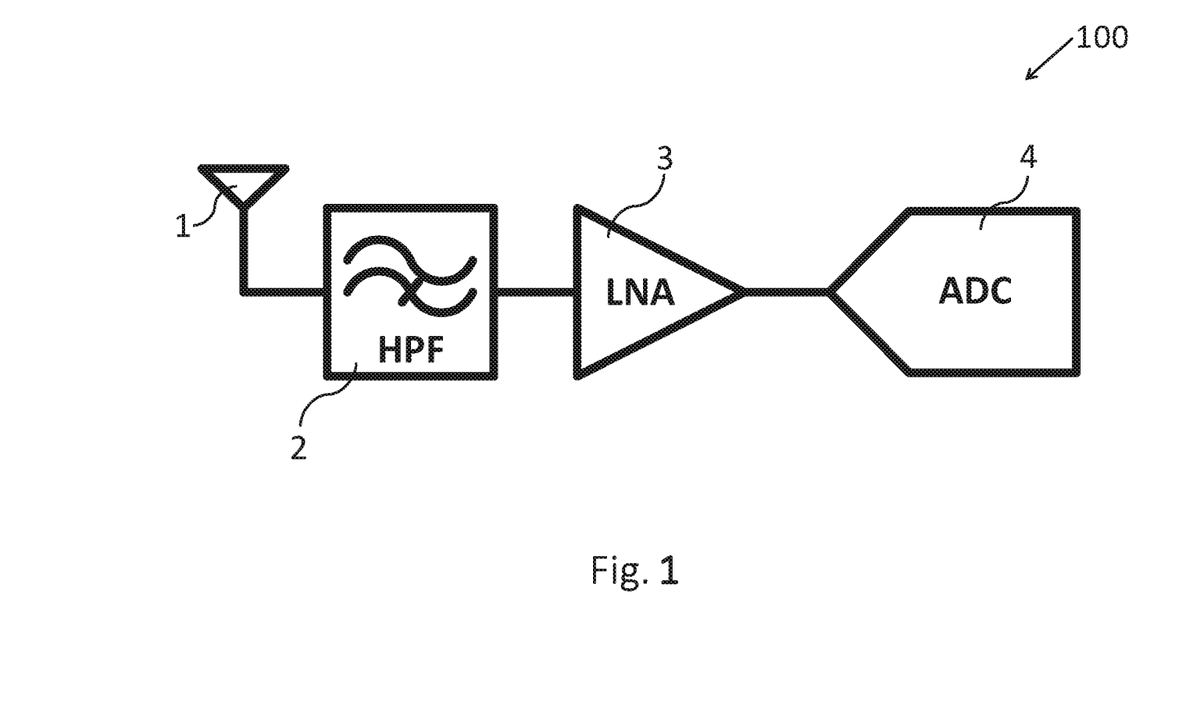
FIG. 1 shows a basic block diagram of a direct sampling receiver front-end suitable for wideband signal processing.

FIG. 1 depicts a typical direct sampling receiver front-end 100 for a wideband receiver operating for example in the 6 to 8.5 GHz band. Antenna 1 receives a RF signal and passes it to high-pass filter 2 which rejects signals below about 6 GHz, with a high rejection notch at around 5.1 to 5.8 GHz (although it will be appreciated that these numbers are provided purely by way of example). The output of high-pass filter 2 feeds to the input of low-noise amplifier 3 which provides gain for the signal of interest across the operating band of 6 to 8.5 GHz. The output of low-noise amplifier 3 is then fed to an analogue-to-digital converter (ADC) 4 that finally digitizes the RF signal.

Figure 2:
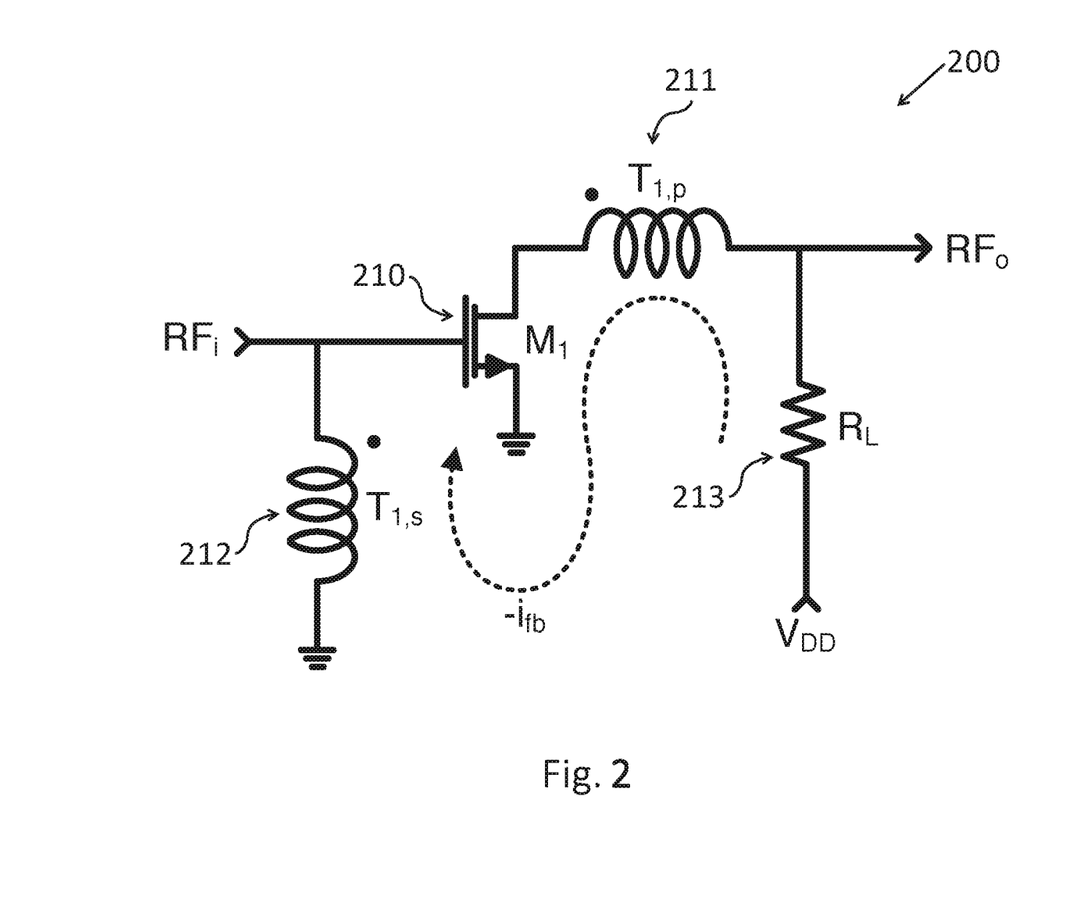
FIG. 2 shows a circuit illustrating a prior art technique for impedance matching.

FIG. 2 shows an amplifier circuit 200 illustrating a prior art technique for impedance matching via negative reactive feedback. Load resistance 213, $R_L$ is connected between the amplifier output $RF_o$ and the power supply $V_{DD}$. The amplifying element 210 (MOSFET transistor $M_1$) is arranged in a common-source configuration with the input signal $RF_i$ applied at its gate. Transformer $T_1$ has a primary winding 211, $T_{1,p}$ connected to the inverting output (drain) of $M_1$ and a secondary winding 212, $T_{1,s}$ connected between ground and the input (gate) of $M_1$. $T_1$ is a non-inverting transformer. The primary winding 211, $T_{1,p}$ senses the current on the drain of the transistor $M_1$ and ac couples it back onto the gate of $M_1$ via $T_{1,s}$. As the current is sensed on the inverting output of $M_1$ and the transistor $T_1$ is non-inverting, the overall result is negative feedback (illustrated by dotted line $-i_{fb}$). This negative feedback defines the input to output current relationship, which in combination with the known transconductance ($g_m$) of the amplifying circuit defines the input impedance of the amplifier 200. By appropriate selection of the transconductance, $g_m$ of $M_1$, the self-inductance and the effective turns ratio of transformer $T_1$, the input impedance can be chosen to match the input (e.g. antenna).

The effective turns ratio of T1 is defined as:

$$\mathrm{sqrt}(L_{1,s}/L_{1,p})/k$$

where k is the mutual coupling factor and $L_{1,s}$ and $L_{1,p}$ are the self-inductances of primary and secondary windings of transformer $T_1$.

There is no $g_m$-boosting of $M_1$ in this circuit 200.

Figure 3:
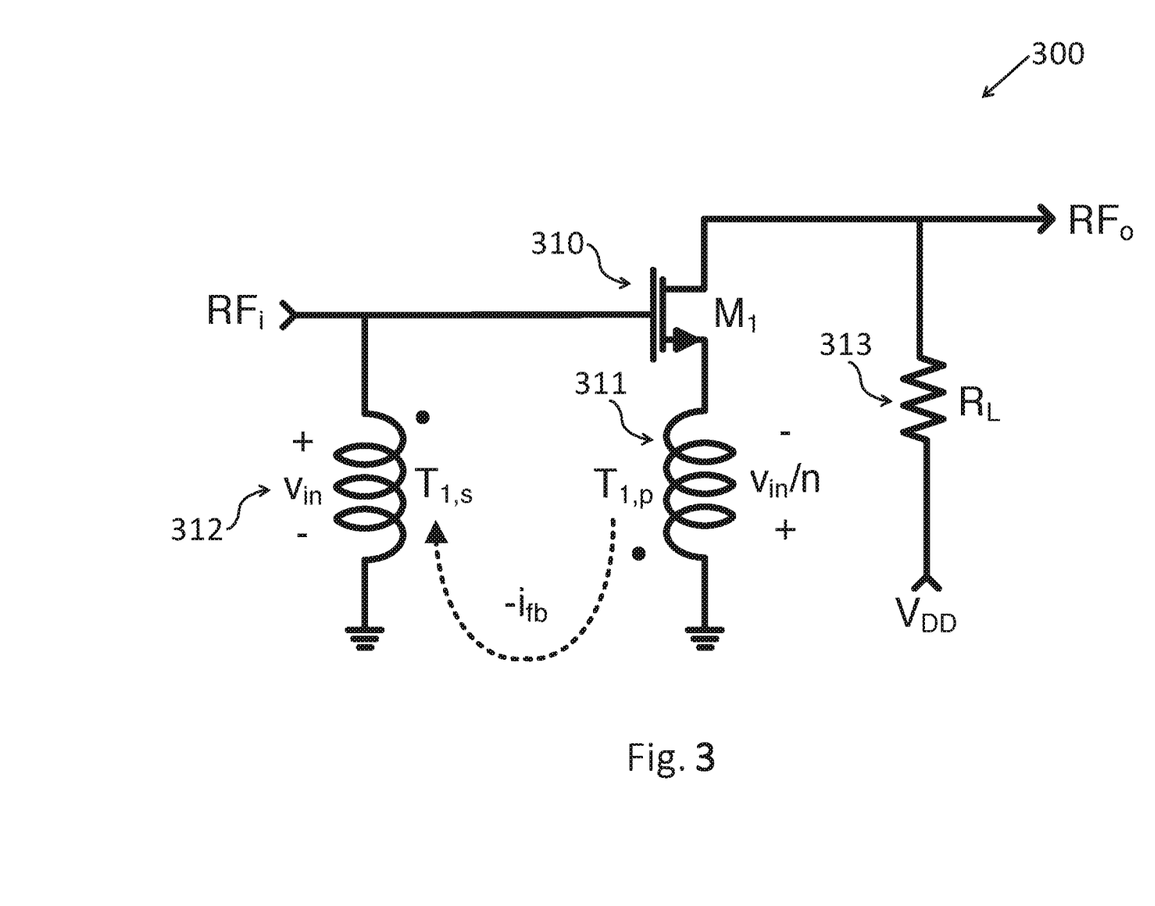
FIG. 3 illustrates a negative reactive feedback circuit with a well-defined input impedance and gain-boosting.

FIG. 3 illustrates a negative reactive feedback circuit 300 with a well-defined input impedance (through the $g_m$ of $M_1$ and turns ratio of $T_1$) and gain-boosting ($g_m$-boosting). This circuit 300 is similar to that of amplifier circuit 200 in several respects. Load resistance 313, $R_L$ is connected between supply rail $V_{DD}$ and the amplifier output $RF_o$. Common-source stage 310 (amplifying element MOSFET $M_1$) provides the amplification. However, the transformer $T_1$ is arranged differently. Instead of the primary winding $T_{1,p}$ being connected to the inverting output (drain) of $M_1$, the primary winding 311, $T_{1,p}$ is connected to the non-inverting output (source) of $M_1$. As the primary winding senses the output current on the non-inverting output, the transformer $T_1$ is arranged as an inverting transformer so as to provide overall negative feedback to the input (gate) of $M_1$ (the feedback again being illustrated by the dashed arrow $-i_{fb}$). With the primary winding 311 connected on the source of transistor 310, the negative mutual coupling between primary winding 311 and secondary winding 312 results in a reduction of the source voltage and thus an increase of the gate-source voltage across transistor 310. An increase in the gate-source voltage boosts the transconductance, $g_m$ of transistor 310, thus improving the gain of the circuit 300.

Figure 4:
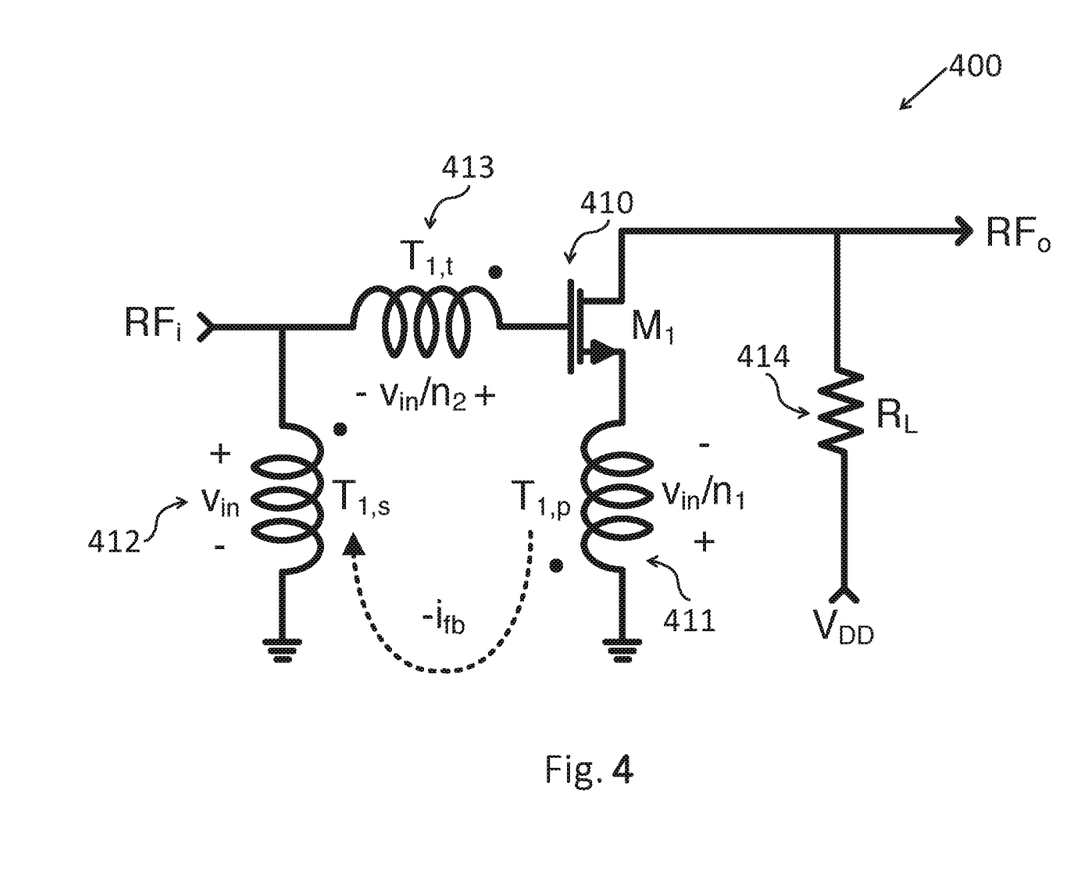
FIG. 4 shows another circuit with a well-defined input impedance and with improved gain-boosting.

The reduction in source voltage (i.e., inversely proportional to the turns ratio) is generally relatively small and therefore the gain boost is also relatively low. FIG. 4 is an improvement over FIG. 3.

FIG. 4 shows another circuit 400 with a well-defined input impedance and with improved gain ($g_m$-boosting).

FIG. 4 illustrates another negative reactive feedback circuit 400 with a well-defined input impedance (through the $g_m$ of $M_1$ and turns ratio of $T_1$) and gain-boosting ($g_m$- boosting). This circuit 400 is similar to that of amplifier circuit 300 in several respects. Load resistance 414, $R_L$ is connected between supply rail $V_{DD}$ and the amplifier output $RF_o$. Common source stage 410 (amplifying element MOSFET $M_1$) provides the amplification. However, whereas the transformer $T_1$ of circuit 300 was a bifilar transformer with two windings 311, 312, the transformer $T_1$ of circuit 400 is a trifilar transformer with three windings 411, 412, 413. The primary winding 411, $T_{1,p}$ is connected to the source of amplifying element 410 (MOSFET $M_1$) in the same manner as in circuit 300 of FIG. 3. The secondary winding 412, $T_{1,s}$ is connected between the input signal $RF_i$ and ground in the same way as circuit 300 of FIG. 3 and thus the negative reactive feedback (illustrated by dashed arrow $-i_{fb}$) operates in exactly the same way as in circuit 300 of FIG. 3, thus defining the input impedance of the amplifier 400. The tertiary winding 413, $T_{1,t}$ of $T_1$ is connected between the input signal $RF_i$ and the gate of the transistor 410. While the primary winding 411 and the secondary winding 412 are in current-inverting relationship, the secondary winding 412 and tertiary winding 413 are in non-inverting relationship. Therefore, the input voltage sensed across secondary winding 412 is mutually coupled to tertiary winding 413 and adds to the gate voltage of transistor 410, i.e.

the secondary winding 412 and tertiary winding 413 boost the gate voltage and therefore increase the gate-source voltage of transistor 410, $M_1$. The mutual coupling of primary winding 411 and secondary winding 412 still applies in the same way as was described in relation to FIG. 3 above and therefore the source voltage is reduced, further increasing the gate-source voltage of $M_1$ and providing higher $g_m$-boosting, although the contribution to the $g_m$-boosting from the coupling of secondary winding 412 and tertiary winding 413 will typically be a lot greater. This circuit 400 thus provides a significantly improved gain compared with the circuit 300 of FIG. 3, still with well-defined input impedance.

However, a limitation of the circuit 400 is that there is also mutual coupling between the tertiary winding 413, $T_{1,t}$ and the primary winding 411 $T_{1,p}$. This mutual coupling increases the voltage on the source of $M_1$ and therefore decreases the gate-source voltage and reduces the $g_m$-boosting. Despite this limitation, the circuit 400 is still a significant improvement over the circuit 300, but this unwanted coupling from tertiary 413 to primary 411 puts a cap on the achievable gain.

Figure 5:
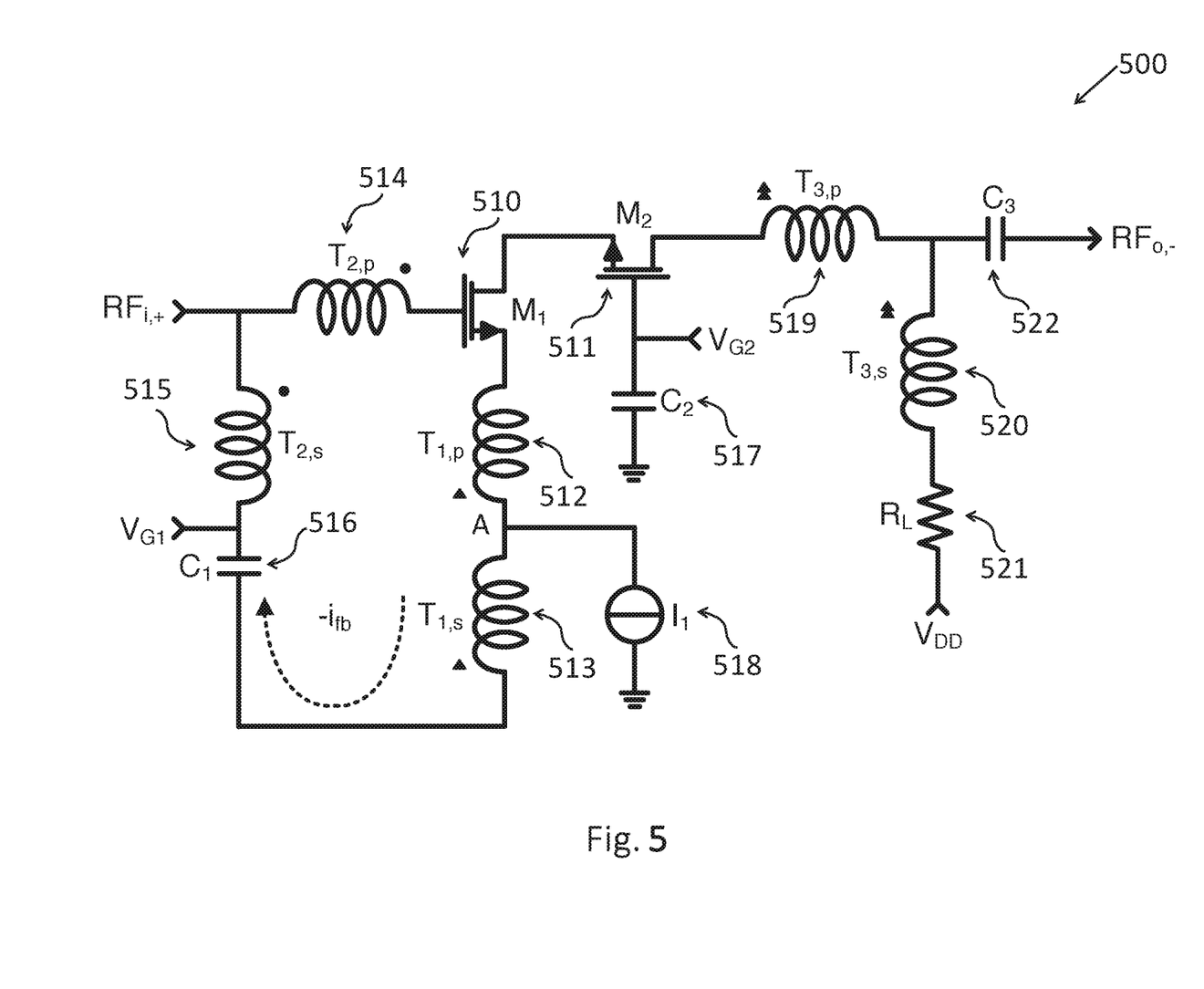
FIG. 5 shows a circuit according to an embodiment of the invention with well-defined input impedance and improved gain-boosting.

FIG. 5 shows an embodiment of the invention. Circuit 500 also provides negative reactive feedback and $g_m$-boosting across the amplifying element 510 (MOSFET transistor $M_1$) arranged in common-source configuration. However, the arrangement avoids the use of a trifilar transformer and thereby avoids the unwanted coupling between the tertiary and primary windings that is described above in relation to circuit 400 of FIG. 4.

First transformer $T_1$ is an auto-transformer having primary winding 512, $T_{1,p}$ and secondary winding 513, $T_{1,s}$ arranged in current-inverting relationship. Although it is not essential, $T_1$ is a symmetric autotransformer and is thus essentially a center-tapped inductor, with the primary and secondary windings 512, 513 having equal self-inductances. The center-tap of inductor $T_1$ (node A) is connected to dc ground through current source 518, $I_1$ which serves to pull dc current through the amplifier circuit 500 from power supply $V_{DD}$.

Second transformer $T_2$ is similar to the secondary and tertiary windings of trifilar transformer $T_1$ of FIG. 4. The primary winding 514, $T_{2,p}$ of second transformer $T_2$ is connected between the amplifier input and the gate of transistor 510, $M_1$. The secondary winding 515, $T_{2,s}$ of second transformer $T_2$ is connected between the amplifier input and a dc bias voltage $V_{G1}$ (for biasing transistor 510 in saturation). Transformer $T_2$ senses part (most) of the input voltage across secondary winding 515 and applies it across primary winding 514. Transformer $T_2$ is in non-inverting configuration and therefore boosts the voltage at the gate of transistor 510, thus enhancing the gate-source voltage and consequently boosting the transconductance, $g_m$ of $M_1$.

For the negative reactive feedback loop (illustrated by dashed line, $-i_{fb}$) in the circuit 500, the primary winding 512, $T_{1,p}$ senses a fraction of the output current at the source of transistor 510 and ac couples the sensed current to the secondary winding 513. This coupled feedback current is ac coupled to the gate of amplifying element 510 (transistor $M_1$) via the secondary winding 515, $T_{2,s}$ of second transformer $T_2$, but is coupled through a dc blocking capacitor 516, $C_1$ so as to ensure that the two sides of the transistor 510 are dc isolated from each other (and therefore allowing the gate-source voltage to be developed across $M_1$).

As the second transformer $T_2$ and the first transformer $T_1$ are not mutually coupled, there is no unwanted coupling across the transistor 510 input as there was with the trifilar arrangement of FIG. 4. Accordingly, the circuit 500 does not suffer from the same limitation in $g_m$-boosting of $M_1$. The circuit 500 is in fact capable of achieving a $g_m$-boost greater than 1 which is higher than that of circuit 400 of FIG. 4.

A further advantage of circuit 500 is that the first transformer $T_1$ and the second transformer $T_2$ are autotransformers. The trifilar transformer of circuit 400 of FIG. 4 needs to be fabricated in a two thick metal layer fabrication process in order to achieve high mutual coupling for better electrical performance. However, the two metal layer fabrication process is time consuming and expensive, pushing up the price of the integrated circuit. By contrast, the autotransformers of circuit 500 can be formed in a one thick metal layer as they can be tightly wound for high coupling in the single layer process, thus greatly reducing the cost of the amplifier 500.

The circuit 500 also illustrates a further amplification stage which is not essential to the invention, but provides additional amplification and other advantages. Second amplifying element 511, $M_2$ is connected to first amplifying element 510, $M_1$ in common-gate configuration. The gate of $M_2$ is biased in the saturation region by bias voltage $V_{G2}$ and is connected to ground through capacitor 517, $C_2$ to from an ac ground node for stability of $M_2$. Third transformer $T_3$ (which in this embodiment is another autotransformer and thus also suitable for the single thick metal layer fabrication process) has primary winding 519, $T_{3,p}$ connected between the drain of $M_2$ and the amplifier output $R_{Fo}$. (via ac coupling capacitor 522, $C_3$) and secondary winding 520, $T_{3,s}$ connected between the amplifier output $R_{Fo}$. and supply voltage $V_{DD}$ through the peaking resistance 521, $R_L$. Third transformer $T_3$ is an asymmetrical autotransformer (with an effective turns ratio in this example of 1:sqrt(2)), in non-inverting configuration. $T_3$ provides passive current gain. The ac coupling capacitor 522, $C_3$ provides dc isolation from the next processing stage.

In variations of the circuit 500 described above, the first transformer $T_1$ could be formed as a bifilar transformer instead of an autotransformer. This might be applicable in circuits where a two thick metal layer process is already required for other reasons in which case high mutual coupling can be achieved with area efficiency. An advantage of using a bifilar transformer for the first transformer $T_1$ is that the primary and secondary windings are dc decoupled which removes the need for the dc blocking capacitor $C_1$. Instead, the dc decoupling between primary winding 512 and secondary winding 513 achieves the same effect and the secondary winding 513 can be connected directly to the secondary winding 515 of second transformer $T_2$. Similarly, the second transformer $T_2$ may be formed as a bifilar transformer instead of as an autotransformer. This variation may be made regardless of whether the first transformer $T_1$ is a bifilar or an autotransformer.

The circuit 500 is shown as a single-ended circuit. However, it can easily be adapted for use in a differential amplifier simply by replicating the circuit for the other half of the differential signal. The two half circuits can simply be connected together at node A, thereby forming an ac ground at node A. The two circuit halves could have separate current sources or could share the single current source $2I_1$. As a variation on this arrangement, the differential circuit may then also be used as a pseudo-differential circuit simply by connecting node A directly to dc ground and removing current source $I_1$ from the circuit.

Figure 6:
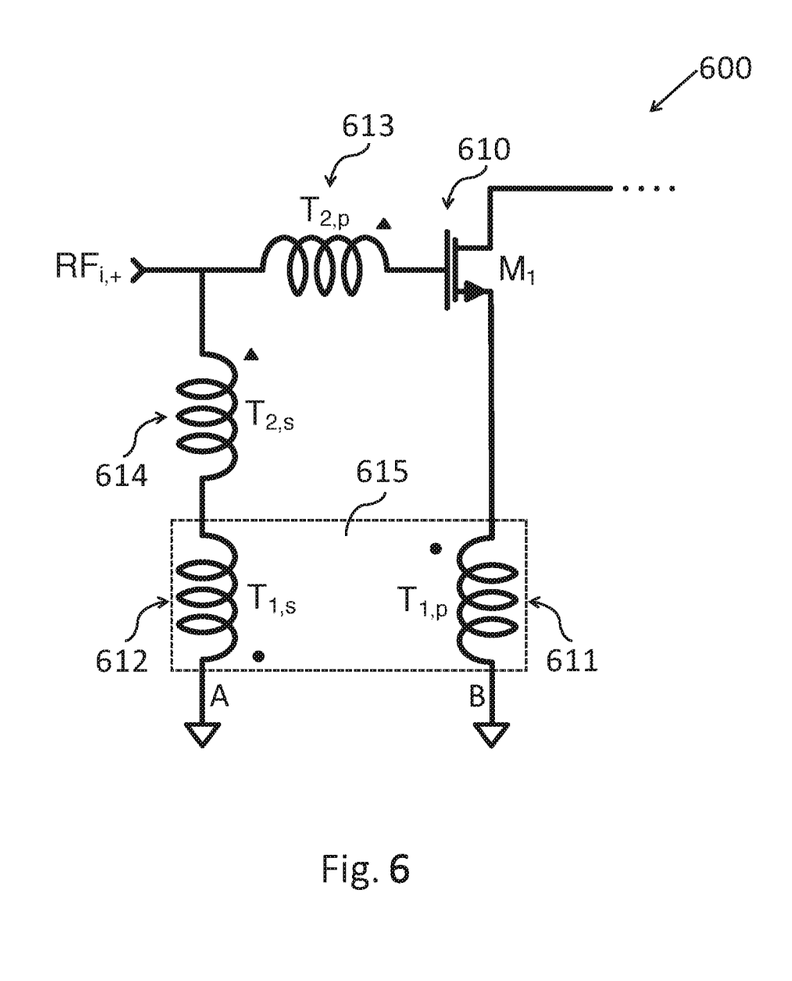
FIG. 6 shows a half-circuit of a differential amplifier using similar circuit to FIG. 5.

FIG. 6 shows a half-circuit of a differential amplifier 600 using the principles of the circuit of FIG. 5, but using a bifilar transformer 615 (indicated by dashed box) for $T_1$. As described above, the primary winding 611, $T_{1,p}$ is dc decoupled from secondary winding 612, $T_{1,s}$ but still ac couples the negative feedback current from the source of transistor 610, $M_1$ to the gate thereof. Transformer $T_2$ is an autotransformer as before with primary winding 613, $T_{2,p}$ and secondary winding 614, $T_{2,s}$.

The ac ground nodes are indicated by nodes A and B at the bottom of the figure and the second half circuit is simply formed as a mirror image about these nodes. The transistor gates can be biased with a dc potential applied at node A. The low-noise amplifier can be biased with a dc current source connected to node B. Alternatively, for a pseudo-differential LNA, node B can be connected to dc ground.

With the differential circuit created by mirroring around nodes A and B, it can be appreciated that the two primary windings $T_{1,p}$ either side of node A form a centre-tapped inductor. Similarly, the two secondary windings $T_{1,s}$ either side of node B form a centre-tapped inductor. These two centre-tapped inductors can be formed as a single transformer, e.g., $T_1'$ with centre-tapped primary and centre-tapped secondary windings.

FIGS. 7 to 10 show various simulation results of the circuit of FIG. 5.

Figure 7:
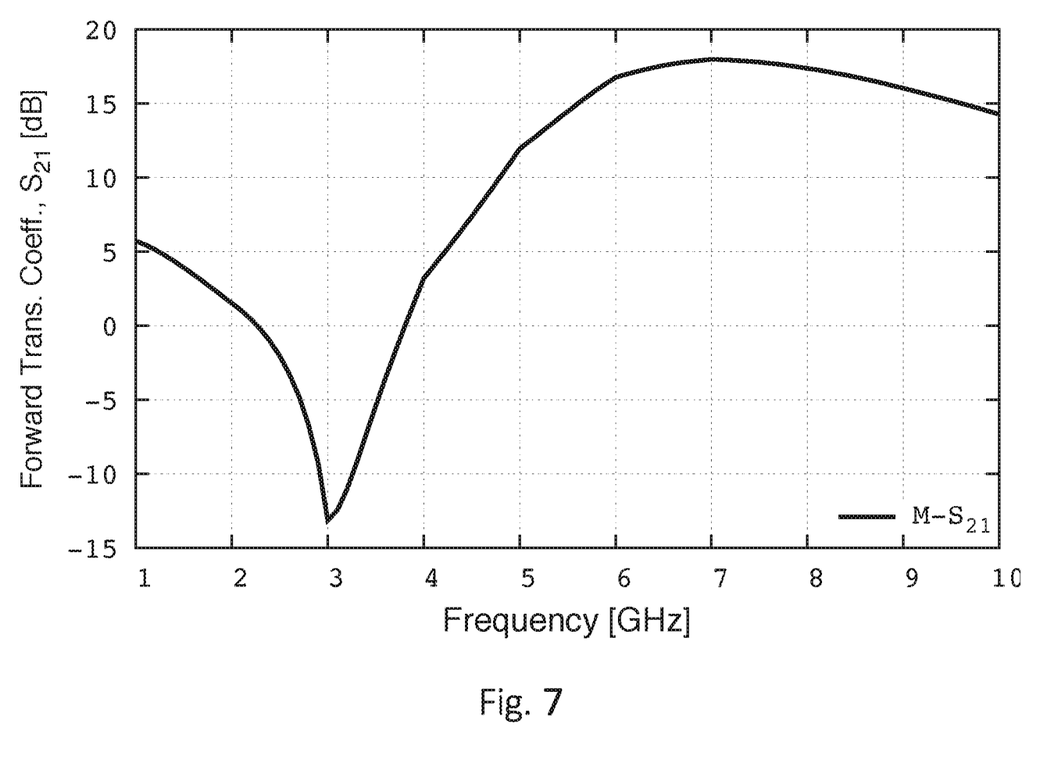
FIG. 7 shows the forward transmission coefficient ($S_{21}$) of the low-noise amplifier of FIG. 5.

FIG. 7 shows the forward transmission coefficient ($S_{21}$) of the low-noise amplifier of FIG. 5. High gain (greater than 15 dB is shown for frequencies above 6 GHz. FIG. 7 also shows that the low-noise amplifier has a single harmonic trap high-pass like frequency response with a notch around 3 GHz.

Figure 8:
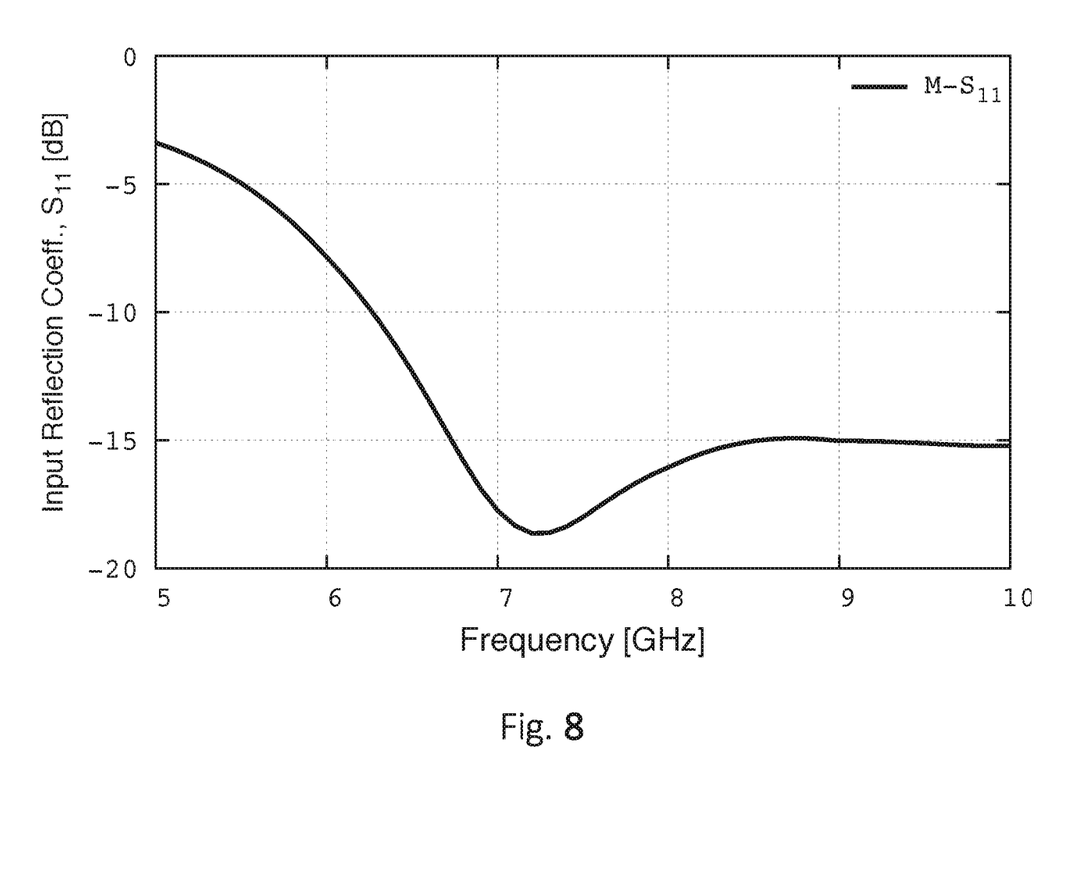
FIG. 8 shows the input reflection coefficient ($S_{11}$) of the low-noise amplifier of FIG. 5.

FIG. 8 shows the input reflection coefficient ($S_{11}$) of the differential low-noise amplifier. FIG. 8 shows that the low-noise amplifier is impedance matched ($S_{11}$<−10 dB) to 100Ω over most of the passband (6 to 8.5 GHz).

Figure 9:
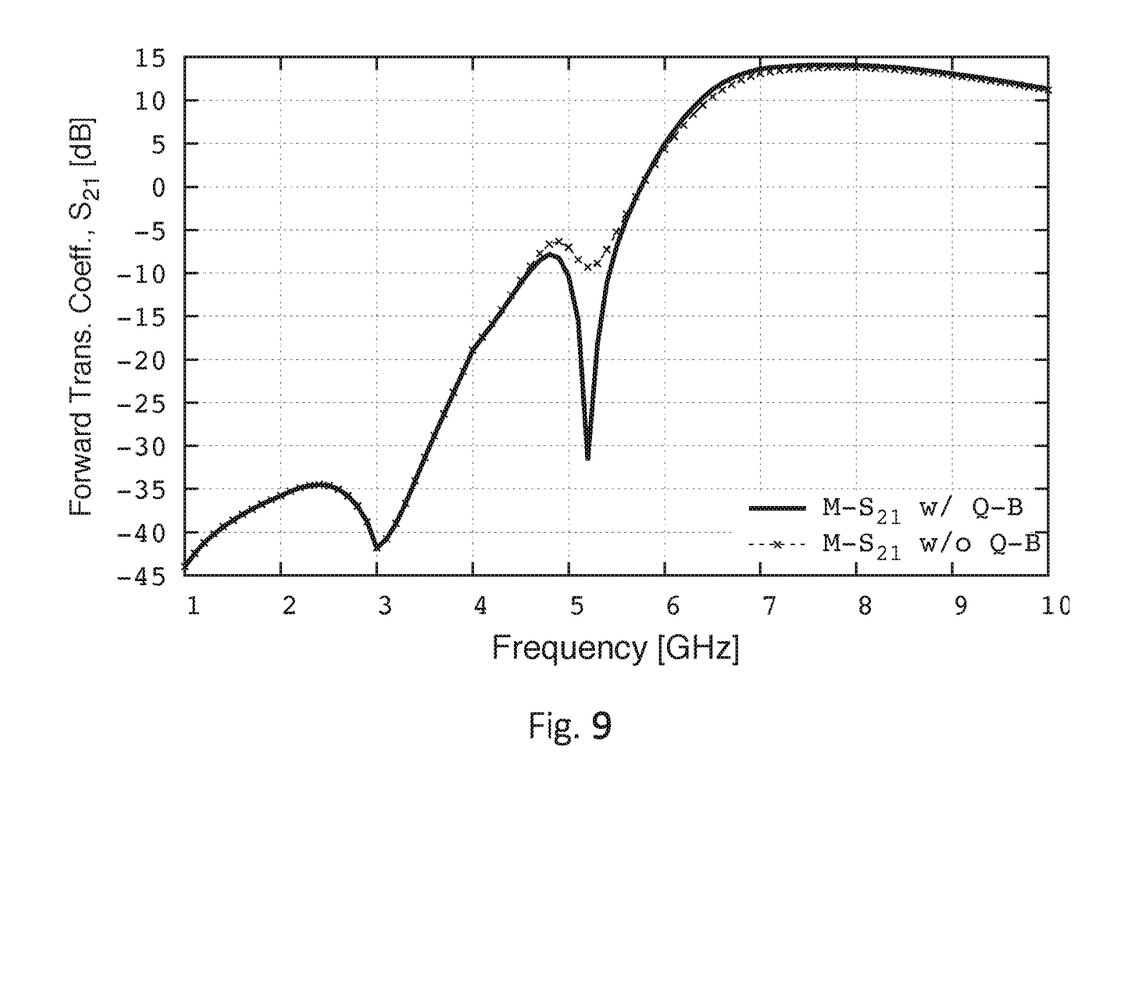
FIG. 9 shows the forward transmission coefficient ($S_{21}$) of the low-noise amplifier of FIG. 5 when combined with a passive high-pass filter (with and without active Q-boosting)

FIG. 9 shows the $S_{21}$ of the low-noise amplifier when combined with a passive high-pass filter (with and without active Q-boosting). The combined frequency response of the LNA with a high-pass filter results in >50 dB rejection at round IEEE 802.11b/g (i.e., WLAN at 2.4 GHz). The high-pass filter used in this simulation includes a Q-boosting arrangement to boost the Q of the inductive components of the HPF. Results are shown in FIG. 9 with Q-boosting enabled as well as without Q-boosting enabled (i.e. with a fifth-order elliptic HPF).

Figure 10:
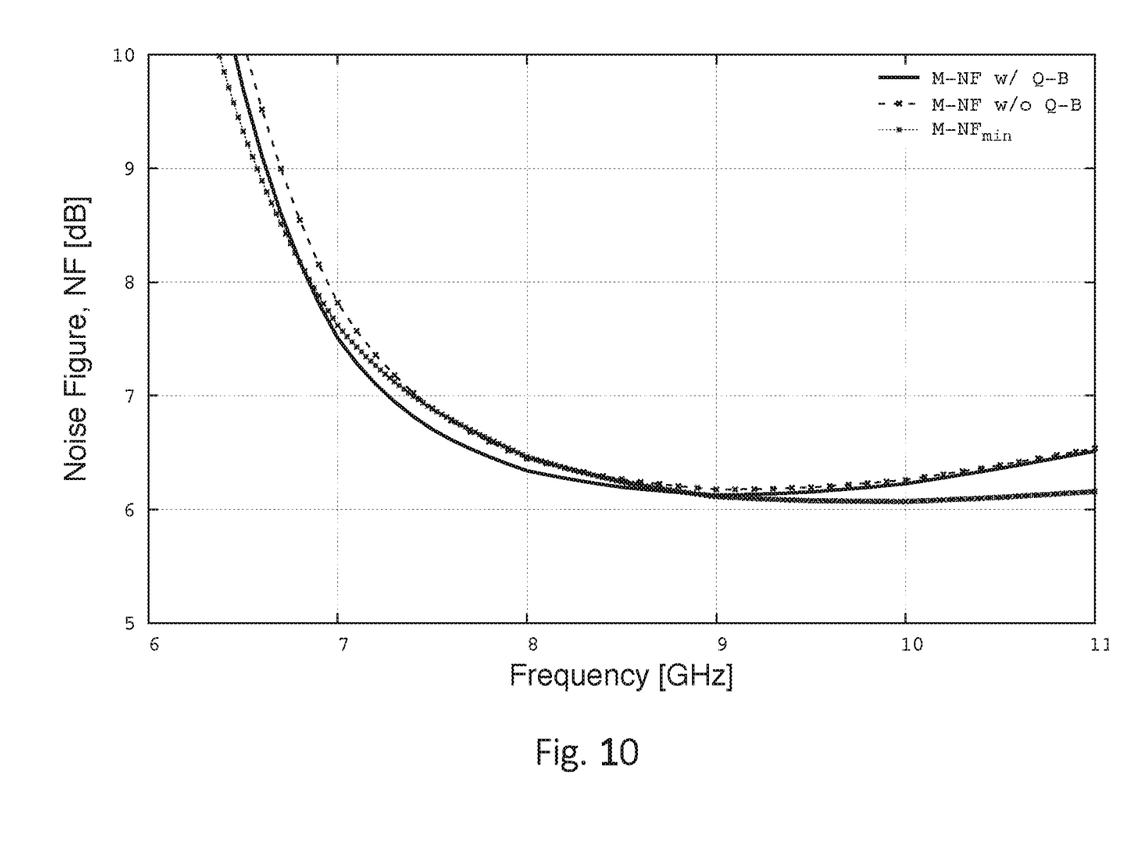
FIG. 10 shows the noise figure of the low-noise amplifier of FIG. 5 when combined with a passive high-pass filter (with and without active Q-boosting).

FIG. 10 shows the noise figure of the the low-noise amplifier of FIG. 5 when combined with a passive high-pass filter (again, with and without active Q-boosting of the inductive components of the HPF). The differential LNA is biased at around the minimum possible noise figure. It is impedance (input only) and noise-matched to 100Ω by proper sizing (i.e., aspect ratio, W/L) of the input common-source transistor $M_1$ in combination with the effective turns ratio realized by the negative reactive feedback loop comprising autotransformers $T_1$ and $T_2$.

It will be appreciated that variations and modifications of the above circuits may be made without departing from the scope of the appended claims.

The invention claimed is:

1. An amplifier, comprising:
   an amplifying element having an input side and an output side;
   a first transformer; and
   a second transformer;
   wherein said first transformer on the output side of the amplifying element arranged to mutually couple a fraction of the output current from the amplifying element onto the input side of the amplifying element via a secondary winding of said first transformer and a secondary winding of said second transformer;
   wherein said second transformer on the input side of the amplifying element arranged to increase the input voltage on the input side via mutual coupling of its primary and secondary windings;
   wherein a primary winding of the first transformer is connected to an output of the amplifying element;
   wherein a secondary winding of the first transformer is ac connected to a secondary winding of the second transformer; and
   wherein the primary winding of the first transformer is dc blocked from the secondary winding of the second transformer.

2. An amplifier as claimed in claim 1, wherein the first transformer is an autotransformer and wherein the secondary winding of the first transformer is ac connected to the secondary winding of the second transformer through a capacitive element to provide said dc blocking.

3. An amplifier as claimed in claim 2, wherein said first transformer is a symmetrical autotransformer.

4. An amplifier as claimed in claim 2, wherein the primary winding and the secondary winding of the first transformer are not dc connected such that the first transformer provides said dc blocking.

5. An amplifier as claimed in claim 1, wherein the second transformer is an autotransformer.

6. An amplifier as claimed in claim 5, wherein said second transformer is a symmetrical autotransformer.

7. An amplifier as claimed in claim 1, wherein the first transformer is connected to a non-inverting output of said amplifying element, and wherein the first transformer is arranged as an inverting transformer.

8. An amplifier as claimed in claim 1, wherein the amplifying element is a transistor.

9. An amplifier as claimed in claim 8, wherein the transistor is a FET, preferably a MOSFET.

10. An amplifier as claimed in claim 9, wherein the FET is arranged in a common-source configuration.

11. An amplifier as claimed in claim 10, wherein the first transformer is connected to the FET's source and wherein the second transformer is connected to the FET's gate.

12. An amplifier as claimed in claim 1, wherein the second transformer is an autotransformer and wherein a signal input is applied at an intermediate tap point of the second transformer.

13. An amplifier as claimed in claim 1, wherein the first transformer is an autotransformer and wherein a dc current source is connected at an intermediate tap point between the primary and secondary windings of the first transformer.

14. An amplifier as claimed in claim 1, wherein the first transformer is an autotransformer, wherein the second transformer is an autotransformer and wherein the self-inductances of the second transformer windings are greater than the self-inductances of the first transformer windings.

15. A differential amplifier comprising a positive signal half and a negative signal half, wherein the positive half and the negative half each comprise an amplifier as claimed in claim 1.

16. A differential amplifier as claimed in claim 15, wherein the first transformer in each of the positive and negative halves has a primary winding and a secondary winding that are not dc connected.

17. A differential amplifier as claimed in claim 16, wherein the primary winding of the first transformer of the positive half and the primary winding of the first transformer of the negative half are directly connected and form a primary winding of a center-tapped transformer; and wherein the secondary winding of the first transformer of the positive half and the secondary winding of the first transformer of the negative half are directly connected and form a secondary winding of said center-tapped transformer.

18. A method of amplifying a signal comprising:
applying the signal to an input of an amplifying element;
sensing the current at an output of said amplifying element with a primary winding of a first transformer;
ac coupling at least a part of said sensed current via a secondary winding of said first transformer and a secondary winding of a second transformer to an input of said amplifying element; wherein said primary winding of said first transformer is dc blocked from said secondary winding of said second transformer; and
coupling a fraction of the input voltage applied to the amplifying element across the secondary winding of the second transformer and adding it to the input signal at the gate of said amplifying element via the primary winding of the second transformer.

* * * * *